US011621145B2

(12) United States Patent
Gamm

(10) Patent No.: US 11,621,145 B2
(45) Date of Patent: Apr. 4, 2023

(54) METHOD FOR OPERATING A PARTICLE BEAM MICROSCOPE

(71) Applicant: Carl Zeiss Microscopy GmbH, Jena (DE)

(72) Inventor: Björn Gamm, Koenigsbronn (DE)

(73) Assignee: Carl Zeiss Microscopy GmbH, Jena (DE)

(*) Notice: Subject to any disclaimer, the term of this patent is extended or adjusted under 35 U.S.C. 154(b) by 504 days.

(21) Appl. No.: 16/937,058

(22) Filed: Jul. 23, 2020

(65) Prior Publication Data

US 2021/0027982 A1   Jan. 28, 2021

(30) Foreign Application Priority Data

Jul. 26, 2019   (DE) .......................... 102019120279.5

(51) Int. Cl.
| | | |
|---|---|---|
| *H01J 37/28* | (2006.01) | |
| *H01J 37/26* | (2006.01) | |
| *H01J 37/20* | (2006.01) | |
| *H01J 37/22* | (2006.01) | |

(52) U.S. Cl.
CPC ............ *H01J 37/263* (2013.01); *H01J 37/20* (2013.01); *H01J 37/222* (2013.01); *H01J 37/28* (2013.01)

(58) Field of Classification Search
CPC ........ H01J 37/263; H01J 37/20; H01J 37/222; H01J 37/28; H01J 2237/1501; H01J 2237/216; H01J 2237/221; H01J 37/265; G01N 23/00

See application file for complete search history.

(56) References Cited

U.S. PATENT DOCUMENTS

| 6,067,164 A | 5/2000 | Onoguchi et al. |
| 7,062,714 B1 | 6/2006 | Mo et al. |

(Continued)

FOREIGN PATENT DOCUMENTS

| DE | 10 2014 102 080 A1 | 8/2015 |
| DE | 10 2015 001 297 A1 | 8/2016 |

(Continued)

OTHER PUBLICATIONS

German Office Action, with translation thereof, for corresponding DE application No. 10 2019 120 279.5 dated Feb. 26, 2020.

*Primary Examiner* — David P Porta
*Assistant Examiner* — Mamadou Faye
(74) *Attorney, Agent, or Firm* — Fish & Richardson P.C.

(57) ABSTRACT

Two types of operational parameters are used in a particle beam microscope. First parameters influence the image quality, and have settings that are alterable by a user in view of obtaining a better image quality. Second parameters characterize the mode of operation, and the image quality becomes poorer when these change. A mode of operation of the particle beam microscope includes: registering of settings of the first parameters and the second parameters, which the user undertakes in a period of time; analysing a plurality of recorded settings of the first parameters and of the second parameters; determining settings of the first parameters which are advantageous in view of the image quality on the basis of the current settings of the second parameters; and setting the determined advantageous settings of the first parameters.

20 Claims, 2 Drawing Sheets

(56) References Cited

U.S. PATENT DOCUMENTS

2004/0064283 A1\* 4/2004 Preiksas ............... H01J 37/265
                                                    702/107
2016/0225578 A1   8/2016 Preiksas
2017/0117114 A1   4/2017 Zeidler
2019/0148104 A1   5/2019 Preiksas

FOREIGN PATENT DOCUMENTS

DE    10 2015 013 698 A1    4/2017
DE    10 2017 220 398 B3    2/2019
EP          1 403 901 A2    3/2004

\* cited by examiner

METHOD FOR OPERATING A PARTICLE BEAM MICROSCOPE

CROSS-REFERENCE TO RELATED APPLICATION

This application claims benefit under 35 U.S.C. § 119 to German Application No. 10 2019 120 279.5, filed Jul. 26, 2019. The contents of this application are hereby incorporated by reference in their entirety.

FIELD

The disclosure relates to methods for operating particle beam microscopes, including methods that contain the setting of operational parameters of the particle beam microscope in view of a satisfactory image quality.

BACKGROUND

Particle beam microscopes, such as electron beam microscopes or ion beam microscopes, are generally complex technical systems which are typically adjusted for optimum operation. By way of example, a user can select a mode of operation of the particle beam microscope by virtue of setting certain parameters, for instance a beam current to be used for recording particle beam-microscopic images, an acceleration voltage to be used, a distance between the object and an objective lens of the particle beam microscope or an orientation of the object relative to the objective lens. Before particle beam-microscopic images with a satisfactory quality can be recorded for a set mode of operation, the user usually undertakes an adjustment of the particle beam microscope that is matched to the chosen mode of operation. This adjustment often includes the setting of other parameters, such as a focusing, an excitation of the objective lens of the particle beam microscope, an astigmatism correction or a beam deflection of the particle beam generated by a particle source of the particle beam microscope, in such a way that, for example, the particle beam passes centrally through the objective lens.

Finding settings of these parameters of the particle beam microscope such that a satisfactory image quality is obtained often is a time-consuming process, which also assumes significant knowledge and sufficient experience on the part of the user.

SUMMARY

The present disclosure seeks to provide methods for operating a particle beam microscope, which can simplify the adjustment of the particle beam microscope.

A particle beam microscope operable in accordance with the method includes, for example, a particle source, a particle optical unit and an object holder for holding an object to be examined, which are configured to direct a particle beam generated by the particle source onto selectable locations of the object and to generate particle beam-microscopic images of the object. The operation of the particle beam microscope can be characterized by a plurality of operational parameters. The operational parameters have settings which are alterable, such as, by the user or by a controller of the particle beam microscope. The particle beam microscope can have a multiplicity of different operational parameters, the settings of which are alterable in order to reach a multiplicity of different goals. An example of a group of operational parameters is a beam deflection and focusing. Settings of this group of operational parameters are typically undertaken by the user in order to achieve a desired image quality. By way of example, the beam deflection can be implemented between the particle source and an element of the particle optical unit, such as an objective lens of the particle beam microscope. The beam deflection operational parameter setting can be altered by the user with the goal of deflecting the particle beam in such a way that it extends centrally through the element of the particle optical unit in order to reduce possibly arising image aberrations. The focusing operational parameter characterizes the distance to the particle beam microscope from where the generated particle beam has a focus. By way of example, the focusing can be altered by virtue of altering the excitation of the objective lens of the particle beam microscope. Usually, the user alters the focusing setting in view of improving the image quality in such a way that the focus of the particle beam is generated on the surface of the object held at the object holder.

The astigmatism correction operational parameter characterizes the setting of an element in the beam path of the particle beam microscope which influences the beam astigmatism, the user generally adjusting the setting in such a way that the astigmatism of the particle beam striking the object is as low as possible. By way of example, the element influencing the beam astigmatism can be a stigmator, which provides an adjustable electric and/or magnetic quadrupole field that acts on the particle beam.

By way of example, a further group of operational parameters includes the beam current, the acceleration voltage, the position of the object and the orientation of the object. Operational parameters of this group are usually altered by the user in order to be able to use the particle beam microscope in various modes of operation. The beam current denotes the electric current, e.g., measured in ampere, which is guided onto the object by the particles generated by the particle source. The adjustment of the beam current can be achieved by changing the operation of the particle source. If the beam deflection and focusing for a given beam current are set in such a way that a particle beam-microscopic image with a high quality can be recorded, it is usually desirable to readjust the beam deflection and the focusing after the setting of the beam current has been altered in order to be able to again record a particle beam-microscopic image with a comparable quality. Similar statements hold true for the acceleration voltage, which describes the electric potential difference between the particle source and the object. Depending on the type of object examined and the goal of the examination of the object undertaken, it is desirable to implement different settings of the acceleration voltage. Should this setting be altered, it is usually desirable to readjust the settings of beam deflection and/or focusing.

The position of the object holder relative to the particle beam microscope can be altered as a setting with the goal of obtaining particle beam-microscopic images with a small working distance or a large working distance. As a rule, an adjustment of the focusing and/or the beam deflection is desirable after altering the position of the object holder relative to the particle beam microscope.

The setting of the orientation of the object holder relative to the particle beam microscope can be altered with the goal of obtaining particle beam-microscopic images of the object held on the object holder from different perspectives. As a rule, new adjustment of the beam deflection and focusing is likewise desirable after altering the setting of the orientation of the object holder.

According to exemplary embodiments, the method for operating the particle beam microscope includes a registration of settings of the first parameters and the second parameters, which the user undertakes in a period of time and an analysis of a plurality of the registered settings of the first parameters and of the second parameters.

According to exemplary embodiments, the method further includes a determination of settings of the first parameters which are advantageous in view of the image quality on the basis of the current settings of the second parameters. The use of these advantageous settings of the first parameters can make the search of suitable settings of the first parameters easier for the user or completely spare the user therefrom. By way of example, the advantageous settings of the first parameters can be set automatically and subsequently be refined further by the user. For example, it is possible to record a particle beam-microscopic image of the object with the set advantageous values.

According to exemplary embodiments, the method further includes a registering of particle beam-microscopic images recorded in the period of time, wherein the advantageous settings of the first parameters are determined on the basis of an analysis of the particle beam-microscopic images. By way of example, analysing the particle beam microscopic image could include a determination of a measure for an image sharpness of the recorded image.

Embodiments of the method are based on the idea that once the user has provided a given setting for the second parameters, those settings of the registered settings of the first and second parameters in which the settings of the second parameters are the same as, or similar to, the given current setting of the second parameters are selected. Further, from the settings selected thus, it is those settings of the first parameters in which recorded particle beam-microscopic images have had a satisfactory image quality that are selected. The first parameters selected thus are then used as the determined advantageous settings of the first parameters and can be set in order to record particle beam-microscopic images using these settings. However, it is left to the user's discretion to further improve these settings.

According to exemplary embodiments, the analysis of the registered settings of the first parameters and of the second parameters includes an assignment of weights to the registered settings of the first parameters, wherein the determination of the advantageous settings of the first parameters is implemented on the basis of the weights assigned to the registered settings of the first parameters. By way of example, the registered settings of the first parameters can be assigned greater weights if the particle beam-microscopic images recorded with these settings of the first parameters have a high image quality and corresponding lower weights can be assigned to the registered settings of the first parameters if the particle beam-microscopic images recorded with these settings have a comparatively lower image quality. The assigned weight represents the significance or reliability of a given setting of a certain parameter. By way of example, if a mean value is formed, the individual settings contribute to the mean value in accordance with their weight. By way of example, the weight can be a weight factor such that the given setting is multiplied by the weight factor and the product formed thus is a summand in the sum formed to calculate the mean value.

According to exemplary embodiments herein, the advantageous settings of the first parameters can be determined in such a way that the difference between the determined advantageous setting of at least one of the first parameters and a setting which is calculated from a subset of the registered settings of this first parameter by averaging in accordance with the weights is smaller than the difference between the determined advantageous setting of this first parameter and a setting which is calculated from this subset of the registered settings of this first parameter by averaging without taking account of the weights. By way of example, the averaging could include a calculation of an algebraic mean value from a plurality of values.

According to exemplary embodiments, the analysis of the plurality of registered settings of the first parameters and of the second parameters includes a grouping of the registered settings of the second parameters into one or more setting groups of the second parameters and an assignment of at least one subset of the registered settings of the first parameters to respectively one of the setting groups of the second parameters. Here, determining the advantageous setting of the first parameters could include a selection of one of the setting groups of the second parameters on the basis of the current setting of the second parameters. By way of example, the grouping can be implemented on the basis of a cluster analysis of the settings of the second parameters. Various methods for cluster analysis are known, such as partitioning and hierarchical cluster methods. An example of a cluster method is the k-means algorithm.

The grouping of the registered settings of the second parameters can be used to identify similar modes of operations used frequently or often by a user, and to deduce a certain mode of operation of these used modes of operation from the current setting of the second parameters in order then to use the settings of the first parameters which were used in the past in this mode of operation as the advantageous settings of the first parameters.

According to exemplary embodiments, the registered settings of the first parameters of the subset include a plurality of registered settings of the first parameters, which are assigned to the selected setting group.

According to exemplary embodiments, the assignment of weights to the registered settings of the first parameters includes such a determination that a given registered setting of the first parameter receives a weight which increases with the number of settings of the first parameter immediately preceding the given setting of the first parameter, which registered settings of the first parameters together with the given setting of the first parameter are assigned to the same setting group of the second parameters. Hence, settings of the first parameters used frequently in a mode of operation are weighted more strongly than settings of the first parameters that are used less frequently.

According to exemplary embodiments, the second parameters characterize a magnification of the recorded particle beam-microscopic images and the assignment of weights to the registered settings of the first parameters may include such a determination that a given registered setting of the first parameter receives a weight that increases with the magnification. This is based on the idea that the magnification of particle beam-microscopic images is set in accordance with the achievable image quality. An image with a lower magnification but better image quality is often desired to an image with a high magnification but lower image quality. Accordingly, a recording of a particle beam-microscopic image with a high magnification that was triggered by the user is an indication that the first parameters, which influence the image quality, were set "well" in the estimation of the user. Accordingly, it is expedient to increase the weight of these settings.

Consequently, the assignment of weights to the registered settings of the first parameters could also include such a determination that a given registered setting of the first parameter receives a weight which is determined on the basis of the image quality of a particle beam-microscopic image of the object, which was registered with the given registered setting of the first parameter.

According to exemplary embodiments, the second parameters characterize a scanning method used when recording a particle beam-microscopic image and the assignment of weights to the registered settings of the first parameter could for example include a determination such that a given registered setting of the first parameter receives a weight, which increases with the dwell time per pixel of the scanning method and/or which increases with the number of pixels of the recorded image. This is based on the idea that a high quality and long image recording duration set by the user indicates a satisfactory image quality. The dwell time of the beam per pixel expresses how long the particle beam is directed on a location of the object during the recording of an image, the location being assigned to a given pixel of the image. In this case, this location could be scanned multiple times in succession while an image is recorded, and so, for example, the dwell time of the particle beam at the location per scan can be multiplied by the number of scans per image in order to obtain the dwell time of the particle beam per pixel.

According to exemplary embodiments, the method includes the use of a user identification identifying the user of the particle beam microscope as one of the second parameters. This is based on the idea that different users often repeatedly carry out different tasks and have different preferences for the settings and that, for example, the assessment of image sharpness is also subject to subjective criteria.

According to exemplary embodiments, the method includes a wobble step for finding advantageous settings of the first parameters, wherein the assignment of weights to the registered settings of the first parameters includes a determination such that a given registered setting of the first parameter then receives an increased weight if a wobble step has already been performed previously with this setting of the first parameter and unchanged second parameters. This is based on the idea that, as a rule, the settings of the first parameters found by a user following a wobble step are perceived by the user as "better" than the settings of the first parameters before the wobble step. In a wobble step, one or more settings of parameters, such as the focusing, for example, are altered periodically, with the arising particle beam-microscopic image being observed continuously. Should a position of an object in the recorded image be altered with the period of the alteration of the settings, this is an indication of a current setting of at least one first parameter which can be improved further.

According to exemplary embodiments, the assignment of weights to the registered settings of the first parameters includes a determination such that it is determined whether the setting of the stigmator was altered. Like when a wobble step is carried out, this is an indication that the user considers the settings following this step to be better than therebefore.

Further, embodiments of the disclosure provide a particle beam microscope, which is configured to carry out the method explained above.

BRIEF DESCRIPTION OF THE FIGURES

Embodiments of the disclosure are explained in greater detail below with reference to figures. In this case, in the figures.

DESCRIPTION OF EXEMPLARY EMBODIMENTS

Figure 1:
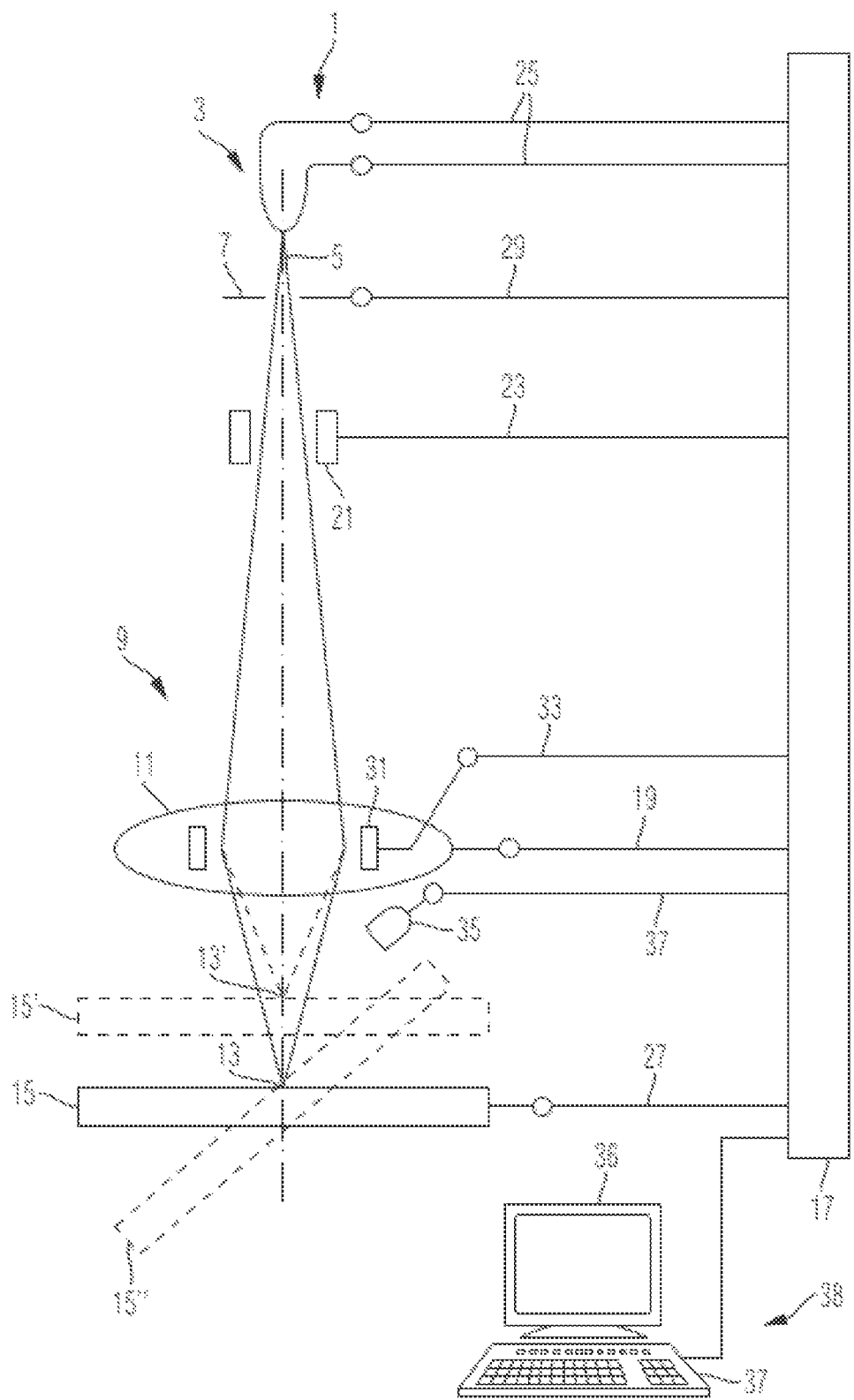
FIG. 1 shows a schematic illustration of a particle beam microscope.

FIG. 1 is a much-simplified illustration of a particle beam microscope 1 with the components that assist the explanation of the method for operating a particle beam microscope.

The particle beam microscope 1 includes a particle source 3, which emits a particle beam 5 that is accelerated toward an electrode 7 in this case. The particle beam 5 passes through the electrode 7 by way of a hole provided in same, and then, subsequently, passes through a particle optical unit 9 including an objective lens 11, the latter focusing the particle beam such that a beam focus 13 arises, which is disposed at a distance from the objective lens 11. An object holder 15 is provided for holding an object to be examined by the particle beam microscope 1. The position and the orientation of the object holder 15 is changeable relative to the objective lens 11. An object holder 15', which is illustrated using dashed lines in FIG. 1, is disposed closer to the objective lens 11 than the object holder 15, which is illustrated using full lines, and an object holder 15", which is illustrated using dashed lines in FIG. 1, is disposed relative to the objective lens 11 with a different orientation to that of the object holder 15, which is illustrated using full lines.

The particle beam microscope can be an electron beam microscope, in which the particle source 3 is an electron source, or an ion beam microscope, in which the particle source is an ion source, such as a helium ion source. The particle beam microscope can be a standalone particle beam microscope or else a particle beam microscope that is integrated into an overarching system including further particle beam microscopes and/or further particle beam columns, which themselves need not have the functionality of the particle beam microscope.

In view of a satisfactory image quality of the particle beam-microscopic images recorded by the particle beam microscope 1, the focus 13 of the particle beam 5 should be set in such a way that the latter arises on the surface of the object to be examined. In order to be able to examine the object held on the object holder 15', the objective lens 11 provides stronger focusing in order to generate the focus 13' on the surface of the object held at the object holder 15'.

An excitation of the objective lens 11 is alterable for the purposes of altering the focusing. The excitation of the objective lens 11 is set by a controller 17, to which the objective lens 11 is connected by way of suitable lines 19. The particle beam microscope 1 further includes beam deflectors 21, which are controlled by the controller 17 by way of suitable connection lines 23. The beam deflectors 21 generate a beam deflection for the purposes of adjusting the particle beam 5 relative to the objective lens 11. As a rule, the beam deflection is set in such a way that the particle beam 5 passes centrally through the objective lens 11.

The particle source 3 is connected to the controller 17 by way of suitable lines 25, in order, firstly, to set the beam current of the particle beam 5 emitted by the particle source 3 and in order, secondly, to set a potential of the particle source 3 relative to a potential of the object holder 15, which is connected to the controller 17 by way of a line 27. Further, the electrode 7 is connected to the controller 17 via a line 29 in order to set the acceleration voltage for the particle beam 5 and the kinetic energy of the latter when incident on the object.

Further, the particle beam microscope 1 includes beam deflectors 31, which are connected to the controller 17 via lines 33 and disposed in the region of the objective lens 11. The beam deflectors 31 are driven by the controller 17 to scan the focus 13 of the particle beam over the surface of the object. A detector 35 for secondary particles or other signals, such as x-ray radiation or cathodoluminescence radiation, for example, is connected to the controller 17 via lines 37 in order to detect signals which are generated by the particle beam 5 incident on the object and which can be assigned to the respective positions of the focus 13 on the object. Systematically scanning the focus over the surface of the object and registering the associated signals with the detector 35 allows a particle beam-microscopic image of the object to be obtained.

The modes of operation of the various components of the particle beam microscope 1 are characterized by different operational parameters. The operational parameters are set by the controller 17 and could also be specified by the user by way of a user interface 38, the latter including a monitor 36 and a keyboard 37, for example.

The various operational parameters can be grouped in many different ways. One possible grouping of the operational parameters into first and second parameters, which is relevant to the method described here, is implemented in such a way that the first parameters are those which are altered by the user, typically in view of a satisfactory image quality, while the second parameters are those which are changed by the user in order to set a mode of operation of the particle beam microscope. According to this classification of the operational parameters, the beam deflection such that the particle beam 5 passes centrally through the objective lens 11 belongs to the first parameters, just like the focusing.

The beam current, the acceleration voltage, the position of the object holder and the orientation of the object holder, the magnification of the recorded image and the scanning speed of the particle beam over the object when recording a particle beam-microscopic image, by contrast, are characterized by the second parameters. Consequently, as a rule, the settings of the second parameters are specified by the user in order to obtain a desired mode of operation of the particle beam microscope. Thereupon, settings of the first operational parameters which facilitate the recording of a particle beam-microscopic image with a satisfactory image quality are sought after. The method described here for operating the particle beam microscope 1 simplifies the search for such settings of the first parameters.

Figure 2:
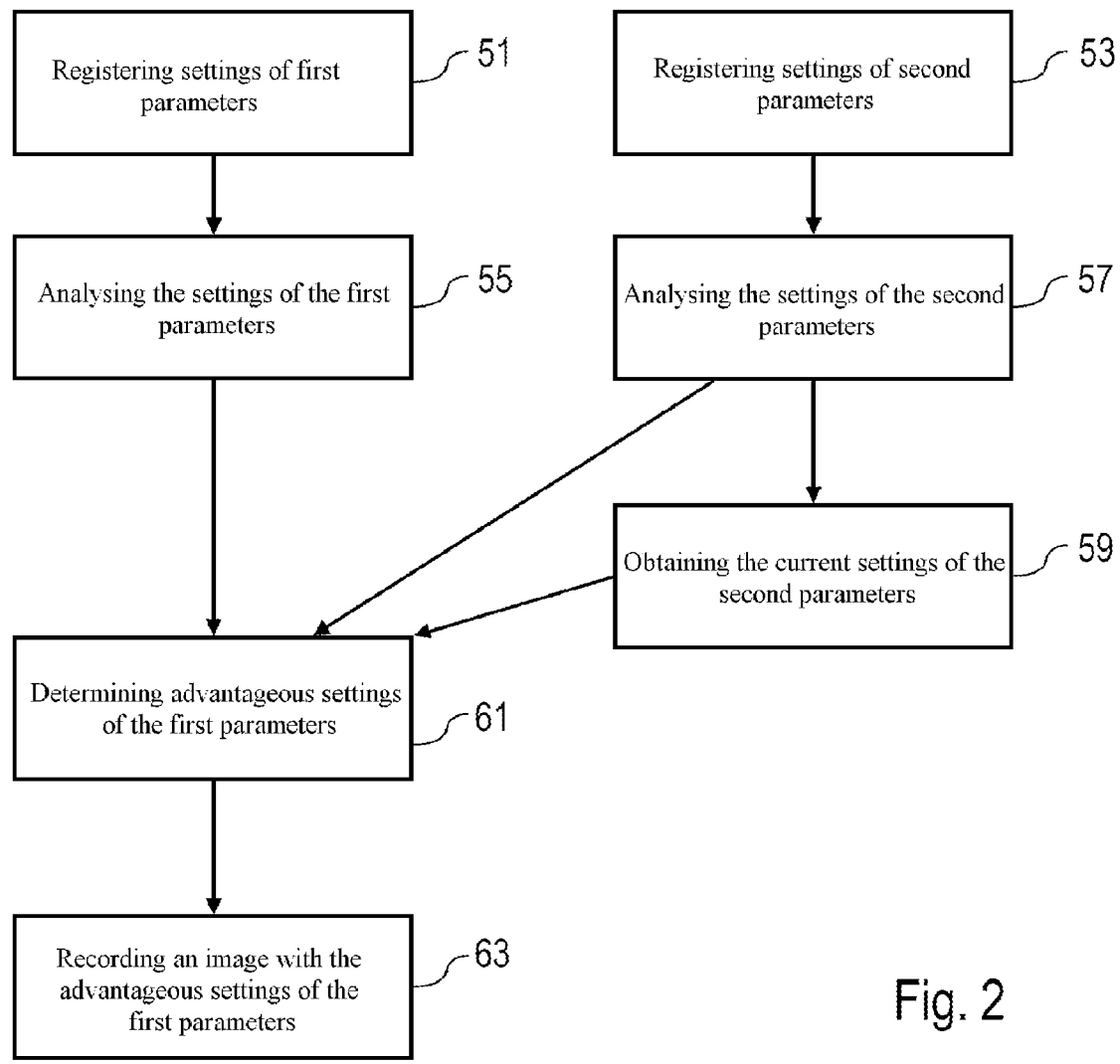
FIG. 2 shows a flowchart for explaining a method carried out with the particle beam microscope illustrated in FIG. 1.

This method is explained below with reference to the flowchart in FIG. 2.

Initially, the particle beam microscope 1 is operated as the user is accustomed from a conventional particle beam microscope. The user examines various objects and, to this end, sets various desired modes of operation of the particle beam microscope by way of specifying settings of the second parameters and then, with the given current setting of the second parameters, changes the settings of the first parameters in view of a satisfactory image quality of the recorded particle beam-microscopic images. In so doing, the user repeatedly records particle beam-microscopic images, assesses these and stores selected images. This procedure of the user is observed by the controller by virtue of the latter registering the settings of the first parameters set by the user in a module 51 and registering the settings of the second parameters set by the user in a module 53. As soon as a sufficient number of the settings of the first and second parameters have been registered, the registered settings of the first parameters are analysed in a module 55 and the registered settings of the second parameters are analysed in a module 57. Further, the current settings of the second parameters are obtained in a module 59. Advantageous settings of the first parameters are determined in a module 61 on the basis of the analysis of the registered settings of the first parameters, the analysis of the registered settings of the second parameters and the obtained current settings of the second parameters. These advantageous settings of the first parameters can be brought to the user's attention by the controller via the user interface 38. The user then has the option of adopting these advantageous settings of the first parameters and specifying these to the controller 17 as settings of the first parameters to be set. Then, the user can cause at least one particle beam-microscopic image to be recorded with the advantageous settings of the first parameters in a module 63 of the method.

Secondly, it is also possible for the controller to directly adopt the ascertained advantageous settings of the first parameters and for the controller to change the associated settings without this being brought to the user's attention and without waiting for a user confirmation.

What is claimed is:

1. A method of operating a particle beam microscope, the particle beam microscope comprising a particle source, a particle optical unit and an object holder configured to hold an object to be examined, the particle beam microscope configured to direct a particle beam generated by the particle source onto selectable locations of the object and to generate particle beam-microscopic images of the object, the method comprising:

registering settings of a plurality of first parameters of the particle beam microscope and a plurality of second parameters of the particle beam microscope, which a user undertakes in a period of time;

analysing a plurality of recorded settings of the first parameters and of the second parameters;

determining settings of the first parameters which are advantageous in view of the image quality on the basis of the current settings of the second parameters; and setting the determined advantageous settings of the first parameters, wherein:

settings of the first parameters are alterable by the user to increase image quality;

the first parameters characterize at least one member selected from the group consisting of the list of beam deflection, focusing and astigmatism correction;

the second parameters characterize a mode of operation of the particle beam microscope;

when the image quality decreases due to changing values of the second parameters, the image quality is increased by changing at least one of the first parameters without further changing values of the second parameters; and the second parameters characterizing at least one member selected from the group consisting of beam current, acceleration voltage, position of the object holder and orientation of the object holder.

2. The method of claim 1, further comprising:
registering particle beam-microscopic images recorded in the period of time; and
determining advantageous settings of the first parameters are determined on the basis of an analysis of the particle beam-microscopic images.

3. The method of claim 1, wherein:
analyzing the plurality of registered settings of the first parameters and of the second parameters comprises an assignment of weights to the registered settings of the first parameters; and
determining the advantageous settings of the first parameters is implemented on the basis of the weights assigned to the registered settings of the first parameters.

4. The method of claim 3, comprising determining the advantageous settings of the first parameters so that a difference between the determined advantageous setting of at least one of the first parameters and a setting which is calculated from a subset of the registered settings of this first parameter by averaging in accordance with the weights is smaller than a difference between the determined advantageous setting of this first parameter and a setting which is calculated from this subset of the registered settings of this first parameter by averaging without taking account of the weights.

5. The method of claim 3, wherein assigning weights to the registered settings of the first parameters comprises a given registered setting of the first parameter receiving a weight which increases with the number of settings of the first parameter registered directly before the given setting of the first parameter, wherein the registered settings of the first parameters together with the given setting of the first parameter are assigned to the same setting group of the second parameters.

6. The method of claim 3, wherein:
the second parameters characterize a magnification of the recorded particle beam-microscopic images; and
the assignment of weights to the registered settings of the first parameters comprises a given registered setting of the first parameter receiving a weight that increases with the magnification.

7. The method of claim 3, wherein assigning weights to the registered settings of the first parameters comprises a given registered setting of the first parameter receiving a weight which is determined on the basis of the image quality of a particle beam-microscopic image of the object, which was recorded with the given registered setting of the first parameter.

8. The method of claim 3, wherein:
the second parameters characterize a scanning method used when recording a particle beam-microscopic image; and
the assignment of weights to the registered settings of the first parameters comprises a given registered setting of the first parameter receiving a weight, which increases: i) with a dwell time of the particle beam per pixel of the scanning method; and/or ii) with the number of pixels of the recorded image.

9. The method of claim 3, further comprising a wobble step, wherein the assignment of weights to the registered settings of the first parameters comprises a given registered setting of the first parameter receiving an increased weight if the wobble step has already been performed previously with this setting of the first parameter and unchanged second parameters.

10. The method of claim 1, wherein:
analyzing the plurality of registered settings of the first parameters and of the second parameters comprises a grouping of the registered settings of the second parameters into one or more setting groups of the second parameters and an assignment of at least one subset of the registered settings of the first parameters to respectively one of the setting groups of the second parameters; and
determining the advantageous settings of the first parameters comprises a selection of one of the setting groups of the second parameters on the basis of the current settings of the second parameters.

11. The method of claim 10, wherein the registered settings of the first parameters of the subset comprise a plurality of registered settings of the first parameters, which are assigned to the selected setting group.

12. The method of claim 10, wherein:
analyzing the plurality of registered settings of the first parameters and of the second parameters comprises an assignment of weights to the registered settings of the first parameters; and
determining the advantageous settings of the first parameters is implemented on the basis of the weights assigned to the registered settings of the first parameters.

13. The method of claim 1, further comprising a recording of at least one particle beam-microscopic image of the object with the set advantageous values.

14. The method of claim 1, further comprising:
registering particle beam-microscopic images recorded in the period of time; and
determining advantageous settings of the first parameters are determined on the basis of an analysis of the particle beam-microscopic images,
wherein:
analyzing the plurality of registered settings of the first parameters and of the second parameters comprises an assignment of weights to the registered settings of the first parameters; and
determining the advantageous settings of the first parameters is implemented on the basis of the weights assigned to the registered settings of the first parameters.

15. The method of claim 14, wherein:
analyzing the plurality of registered settings of the first parameters and of the second parameters comprises a grouping of the registered settings of the second parameters into one or more setting groups of the second parameters and an assignment of at least one subset of the registered settings of the first parameters to respectively one of the setting groups of the second parameters; and
determining the advantageous settings of the first parameters comprises a selection of one of the setting groups of the second parameters on the basis of the current settings of the second parameters.

16. A method of operating a particle beam microscope, wherein:
the particle beam microscope comprises a particle source, a particle optical unit and an object holder for holding an object to be examined and the particle beam microscope is configured to direct a particle beam generated by the particle source onto selectable locations of the object and to generate particle beam-microscopic images of the object;

a plurality of operational parameters of the particle beam microscope are first parameters which influence an image quality of the particle beam microscope, the settings of the parameters being alterable by the user in view of obtaining a better image quality;

the first parameters characterize at least one member selected from the group consisting of beam deflection, focusing and astigmatism correction;

a plurality of operational parameters of the particle beam microscope are second parameters which characterize a mode of operation of the particle beam microscope, the image quality becoming poorer should these change and the image quality needing to be improved by changing at least one of the first parameters in order to obtain a better image quality if the values of the second parameters are intended to be maintained;

the second parameters characterize at least one member selected from the group consisting of beam current, acceleration voltage, position of the object holder and orientation of the object holder; and the method comprises:

registering settings of the first parameters and the second parameters, which the user undertakes in a period of time;

analysing a plurality of recorded settings of the first parameters and of the second parameters;

determining settings of the first parameters which are advantageous in view of the image quality on the basis of the current settings of the second parameters; and setting the determined advantageous settings of the first parameters.

17. The method of claim 16, further comprising:

registering particle beam-microscopic images recorded in the period of time; and determining advantageous settings of the first parameters are determined on the basis of an analysis of the particle beam-microscopic images.

18. The method of claim 16, wherein:

analyzing the plurality of registered settings of the first parameters and of the second parameters comprises an assignment of weights to the registered settings of the first parameters; and determining the advantageous settings of the first parameters is implemented on the basis of the weights assigned to the registered settings of the first parameters.

19. A method, comprising:

providing a particle beam microscope comprising: a particle source; a particle optical unit; and an object holder configured to hold an object to be examined, the particle beam microscope configured to direct a particle beam generated by the particle source onto selectable locations of the object and to generate particle beam-microscopic images of the object;

registering settings of a plurality of first parameters of the particle beam microscope and a plurality of second parameters of the particle beam microscope, which a user undertakes in a period of time;

analysing a plurality of recorded settings of the first parameters and of the second parameters;

determining settings of the first parameters which are advantageous in view of the image quality on the basis of the current settings of the second parameters; and setting the determined advantageous settings of the first parameters, wherein:

settings of the first plurality of parameters are alterable by the user to increase image quality;

the first parameters characterize at least one member selected from the group consisting of the list of beam deflection, focusing and astigmatism correction;

the second parameters characterize a mode of operation of the particle beam microscope, the image quality becoming poorer should these change and the image quality needing to be improved by changing at least one of the first parameters in order to obtain a better image quality if the values of the second parameters are intended to be maintained; and the second parameters characterizing at least one member selected from the group consisting of beam current, acceleration voltage, position of the object holder and orientation of the object holder.

20. The method of claim 19, further comprising:

registering particle beam-microscopic images recorded in the period of time; and determining advantageous settings of the first parameters are determined on the basis of an analysis of the particle beam-microscopic images.

* * * * *